United States Patent
Han et al.

(10) Patent No.: US 9,564,413 B2
(45) Date of Patent: Feb. 7, 2017

(54) SEMICONDUCTOR DEVICE AND METHOD OF FORMING SEMICONDUCTOR DIE WITH ACTIVE REGION RESPONSIVE TO EXTERNAL STIMULUS

(75) Inventors: Byung Joon Han, Singapore (SG); Il Kwon Shim, Singapore (SG); Heap Hoe Kuan, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 13/545,887

(22) Filed: Jul. 10, 2012

(65) Prior Publication Data

US 2013/0069252 A1    Mar. 21, 2013

Related U.S. Application Data

(60) Provisional application No. 61/535,301, filed on Sep. 15, 2011.

(51) Int. Cl.
*H01L 23/00*     (2006.01)
*H01L 23/31*     (2006.01)
(Continued)

(52) U.S. Cl.
CPC ............. *H01L 24/19* (2013.01); *H01L 21/561* (2013.01); *H01L 21/565* (2013.01); *H01L 21/568* (2013.01); *H01L 23/3121* (2013.01); *H01L 23/3128* (2013.01); *H01L 2224/12105* (2013.01); *H01L 2224/24137* (2013.01); *H01L 2224/96* (2013.01); *H01L 2924/01322* (2013.01); *H01L 2924/12041* (2013.01);
(Continued)

(58) Field of Classification Search
CPC ... H01L 24/19; H01L 23/3121; H01L 23/3128
USPC .......... 257/686, 687, 787, E23.116; 438/124
See application file for complete search history.

(56) References Cited

U.S. PATENT DOCUMENTS 7,160,478 B2    1/2007  Leib et al.
7,790,505 B2    9/2010  Lin et al.
(Continued)

FOREIGN PATENT DOCUMENTS

CN    101371367 A    2/2009
TW    201044478 A    12/2010

*Primary Examiner* — S. V. Clark
*Assistant Examiner* — Krista Soderholm
(74) *Attorney, Agent, or Firm* — Robert D. Atkins; Patent Law Group: Atkins and Associates, P.C.

(57) ABSTRACT

A semiconductor device has a first semiconductor die including an active region formed on a surface of the first semiconductor die. The active region of the first semiconductor die can include a sensor. An encapsulant is deposited over the first semiconductor die. A conductive layer is formed over the encapsulant and first semiconductor die. An insulating layer can be formed over the first semiconductor die. An opening is formed in the insulating layer over the active region. A transmissive layer is formed over the first semiconductor die including the active region. The transmissive layer includes an optical dielectric material or an optical transparent or translucent material. The active region is responsive to an external stimulus passing through the transmissive layer. A plurality of bumps is formed through the encapsulant and electrically connected to the conductive layer. A second semiconductor die is disposed adjacent to the first semiconductor die.

25 Claims, 17 Drawing Sheets

(51) Int. Cl.
  *H01L 21/56* (2006.01)
  *H05K 1/18* (2006.01)
  *H05K 3/40* (2006.01)
(52) U.S. Cl.
  CPC ............... *H01L 2924/12042* (2013.01); *H01L 2924/12043* (2013.01); *H01L 2924/1306* (2013.01); *H01L 2924/13091* (2013.01); *H01L 2924/181* (2013.01); *H05K 1/185* (2013.01); *H05K 3/4038* (2013.01); *H05K 2203/1461* (2013.01)

(56) References Cited

U.S. PATENT DOCUMENTS

| | | | |
|---|---|---|---|
| 7,919,410 B2* | 4/2011 | England et al. | 438/667 |
| 8,211,751 B2 | 7/2012 | Yamamoto et al. | |
| 2002/0096753 A1 | 7/2002 | Tu et al. | |
| 2005/0001331 A1 | 1/2005 | Kojima et al. | |
| 2005/0253226 A1 | 11/2005 | Tian et al. | |
| 2005/0285154 A1 | 12/2005 | Akram et al. | |
| 2006/0065964 A1 | 3/2006 | Ohsumi | |
| 2006/0087042 A1 | 4/2006 | Kameyama et al. | |
| 2006/0102974 A1 | 5/2006 | Chen | |
| 2008/0083975 A1 | 4/2008 | Chao et al. | |
| 2008/0179758 A1 | 7/2008 | Wong et al. | |
| 2008/0308928 A1 | 12/2008 | Chang et al. | |
| 2009/0065923 A1* | 3/2009 | Chung | 257/687 |
| 2009/0090412 A1* | 4/2009 | Calwer et al. | 136/259 |
| 2010/0065948 A1 | 3/2010 | Bae et al. | |
| 2010/0140780 A1 | 6/2010 | Huang et al. | |
| 2010/0171205 A1* | 7/2010 | Chen et al. | 257/686 |
| 2010/0224974 A1 | 9/2010 | Shim et al. | |
| 2010/0237496 A1 | 9/2010 | Touzelbaev et al. | |
| 2010/0244221 A1 | 9/2010 | Ko et al. | |
| 2010/0320601 A1 | 12/2010 | Pagaila et al. | |
| 2011/0049662 A1* | 3/2011 | Camacho et al. | 257/434 |
| 2012/0161331 A1 | 6/2012 | Gonzalez et al. | |
| 2012/0248626 A1 | 10/2012 | Lee et al. | |

* cited by examiner

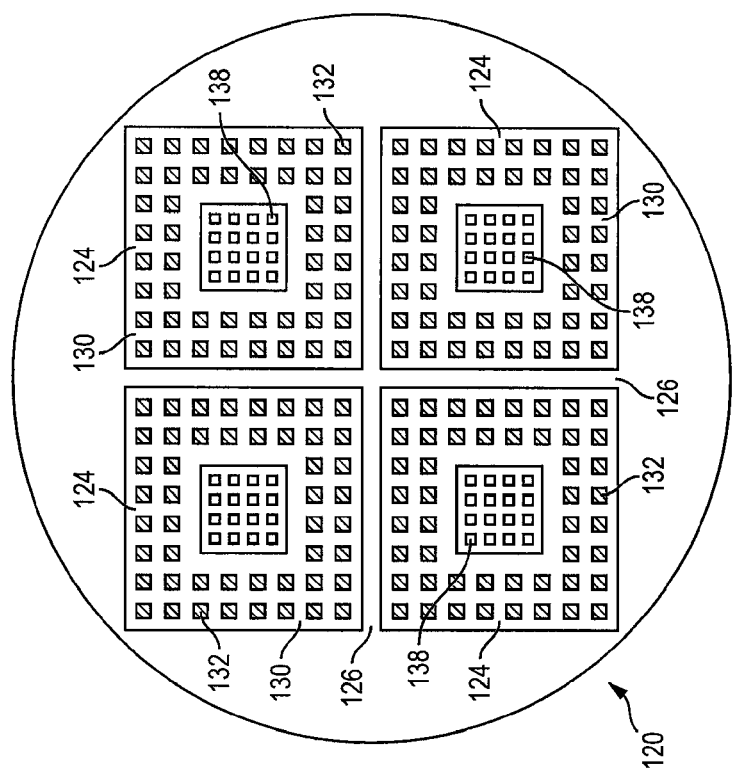
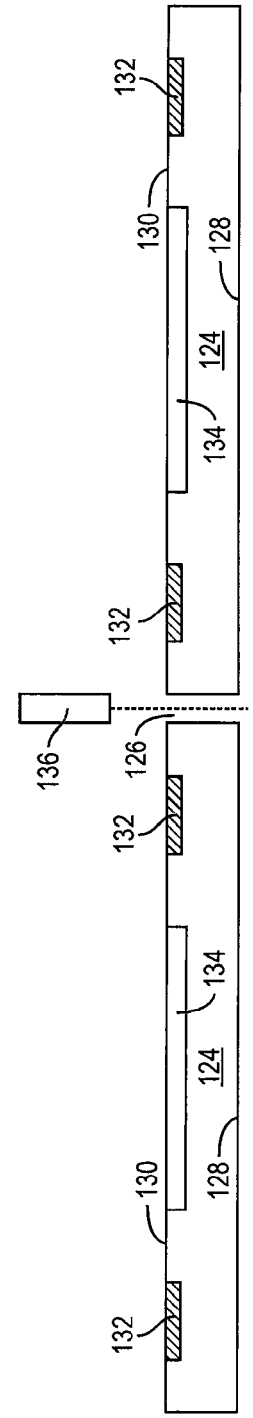

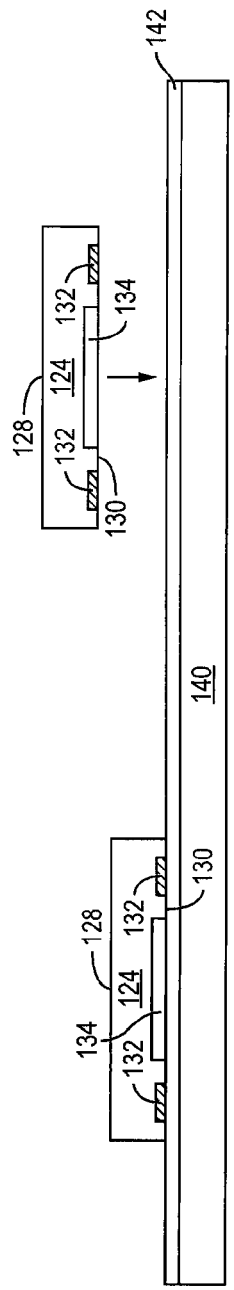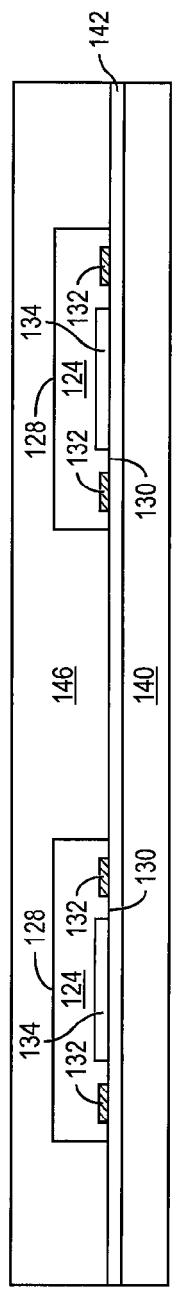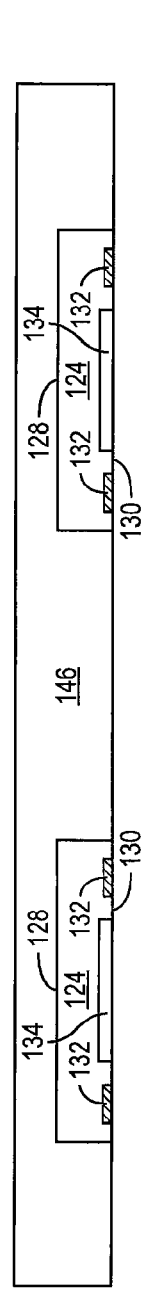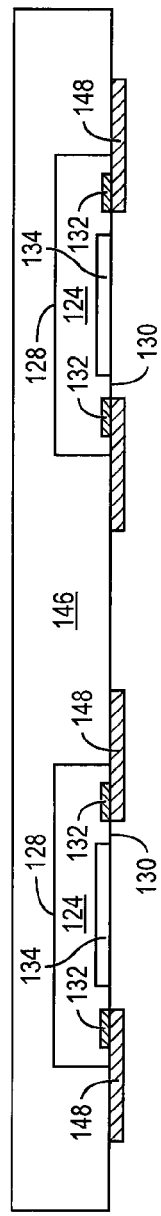
FIG. 4a
FIG. 4b
FIG. 4c
FIG. 4d

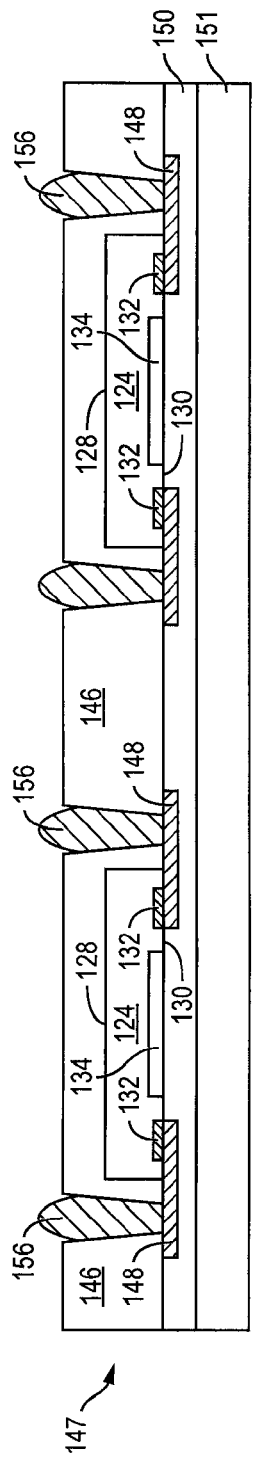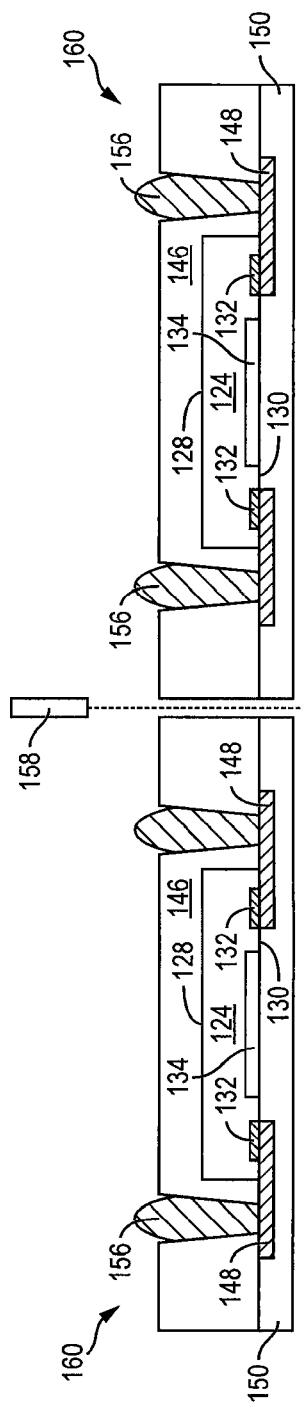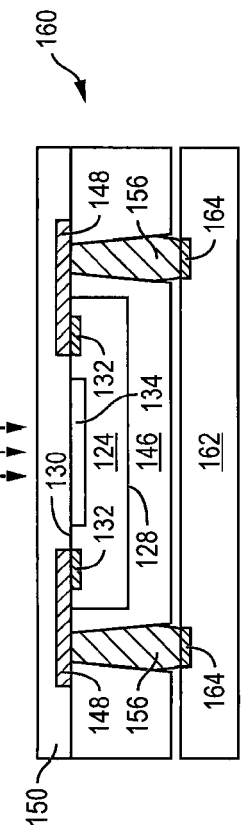

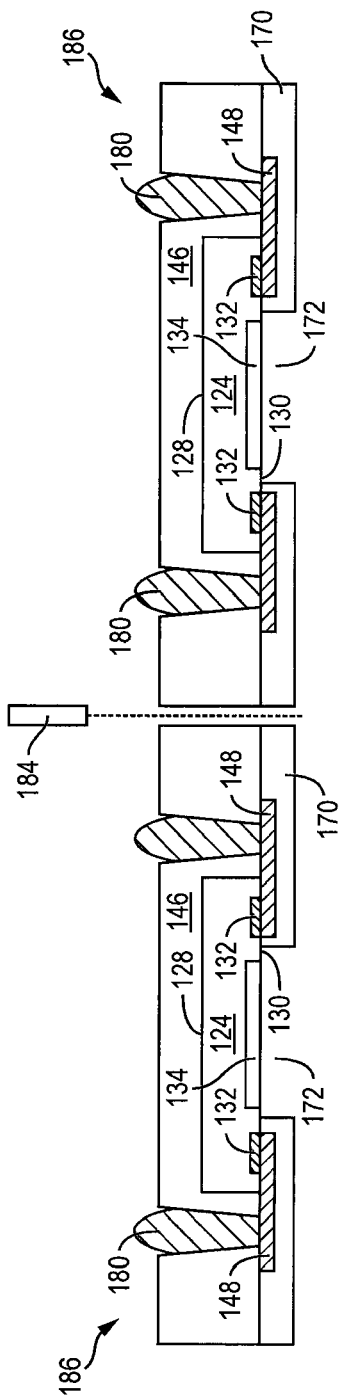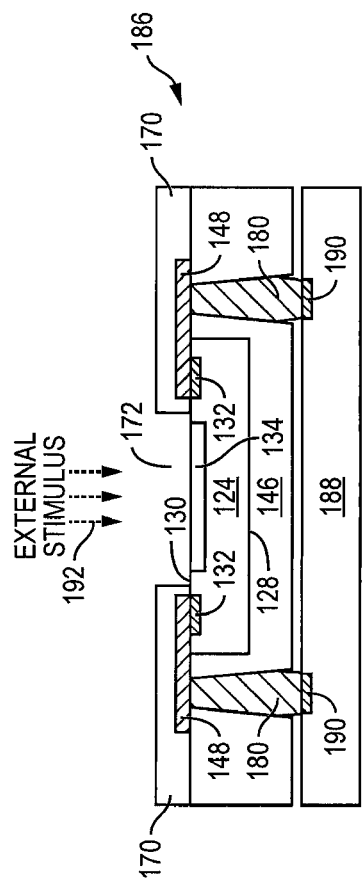

SEMICONDUCTOR DEVICE AND METHOD OF FORMING SEMICONDUCTOR DIE WITH ACTIVE REGION RESPONSIVE TO EXTERNAL STIMULUS

CLAIM OF DOMESTIC PRIORITY

The present application claims the benefit of Provisional Application No. 61/535,301, filed Sep. 15, 2011, which is incorporated herein by reference.

FIELD OF THE INVENTION

The present invention relates in general to semiconductor devices and, more particularly, to a semiconductor device and method of forming a semiconductor die having an active region responsive to an external stimulus.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

A semiconductor die has an active surface containing analog or digital circuits implemented as active devices, passive devices, conductive layers, and dielectric layers formed within the die and electrically interconnected according to the electrical design and function of the die. The active surface performs the electrical and mechanical design function of the semiconductor die. The active surface may also contain a sensor such as a photodiode, phototransistor, Hall effect device, piezoelectric device, nanoelectronic device, and microelectromechanical device. The active surface responses to stimulus such as light, sound, heat, electromagnetic radiation, electric fields, magnetic fields, motion, ionizing radiation, vibration, motion, acceleration, rotation, pressure, and temperature to enable the semiconductor die to perform design functions. For example, an optical sensor on the active surface reacts to light which passes through an opening or window in the semiconductor package to reach the sensor.

SUMMARY OF THE INVENTION

A need exists for a cost effective semiconductor die having an active region that is responsive to an external stimulus. Accordingly, in one embodiment, the present invention is a method of making a semiconductor device comprising the steps of providing a first semiconductor die including an active region formed on a surface of the first semiconductor die, depositing an encapsulant over the first semiconductor die, forming a conductive layer over the encapsulant and first semiconductor die, forming a transmissive layer over the first semiconductor die including the active region, and forming a plurality of bumps through the encapsulant and electrically connected to the conductive layer.

In another embodiment, the present invention is a method of making a semiconductor device comprising the steps of providing a first semiconductor die including an active region formed on a surface of the first semiconductor die, forming an encapsulant over the first semiconductor die, forming an insulating layer over the first semiconductor die, forming an opening in the insulating layer over the active region, and forming an interconnect structure through the encapsulant.

In another embodiment, the present invention is a method of making a semiconductor device comprising the steps of providing a semiconductor die, depositing an encapsulant over the semiconductor die, forming a transmissive layer over the semiconductor die, and forming an interconnect structure through the encapsulant.

In another embodiment, the present invention is a semiconductor device comprising a semiconductor die and encapsulant deposited over the semiconductor die. A transmissive layer is formed over the semiconductor die. An interconnect structure is formed through the encapsulant.

BRIEF DESCRIPTION OF THE DRAWINGS

FIGS. 3a-3d illustrate a semiconductor wafer with a plurality of semiconductor die separated by a saw street;

FIGS. 4a-4j illustrate a process of forming a transmissive layer over an eWLB;

FIG. 5 illustrates the eWLB with a transmissive layer formed over the semiconductor die;

FIGS. 6a-6d illustrate a process of forming a window in an insulating layer over an active region of a semiconductor die in an eWLB;

FIG. 7 illustrates the eWLB with the window in the insulating layer over the active region of the semiconductor die;

DETAILED DESCRIPTION OF THE DRAWINGS

Figure 1:
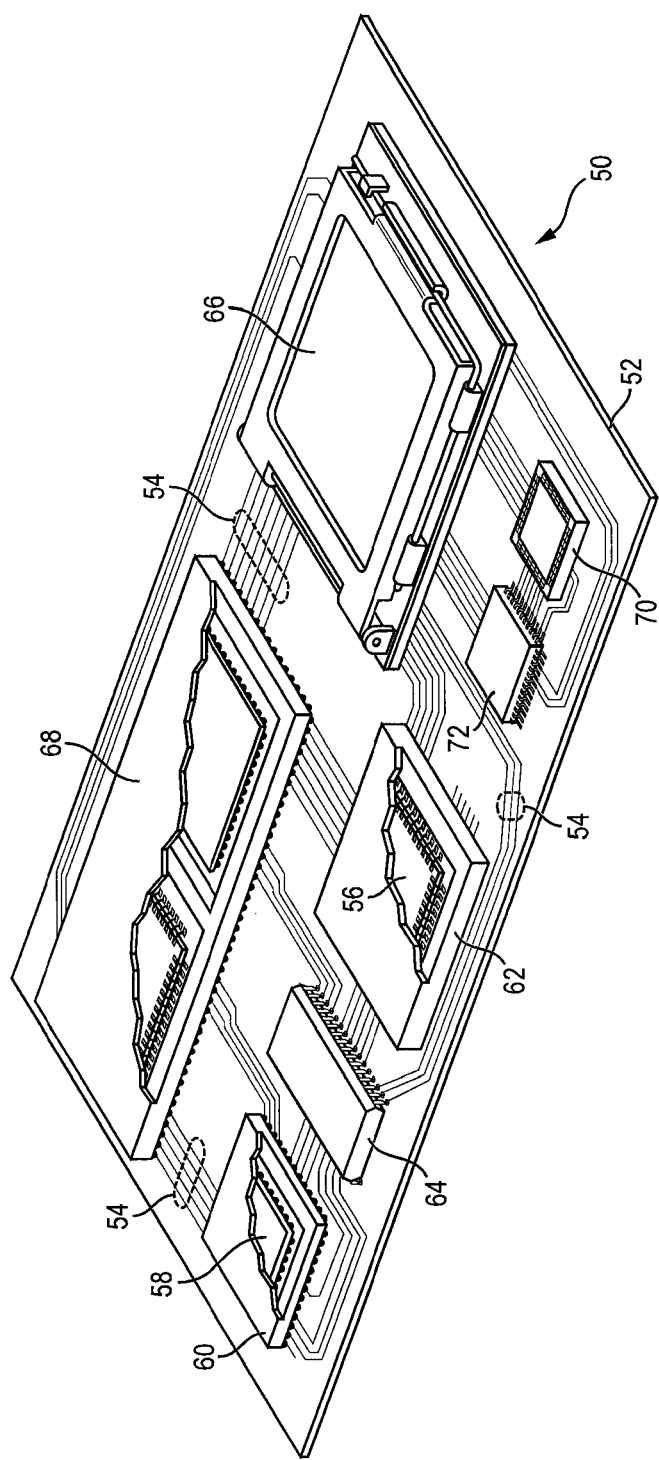
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e., the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e., the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or PCB 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
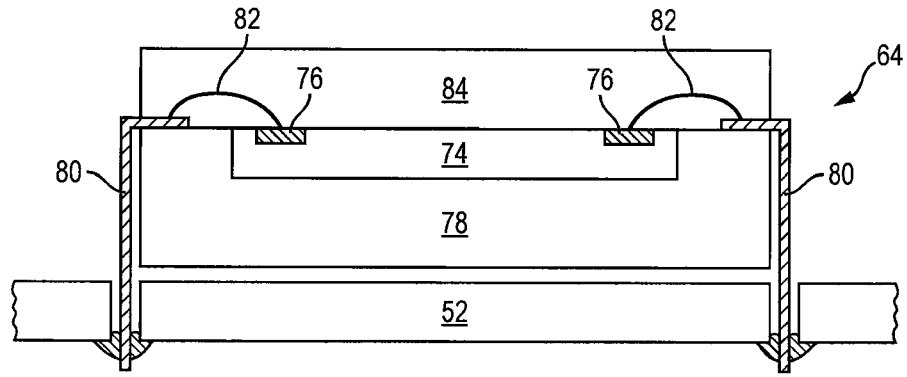
FIGS. 2a-2c illustrate further detail of the representative semiconductor packages mounted to the PCB.
Figure 2B:
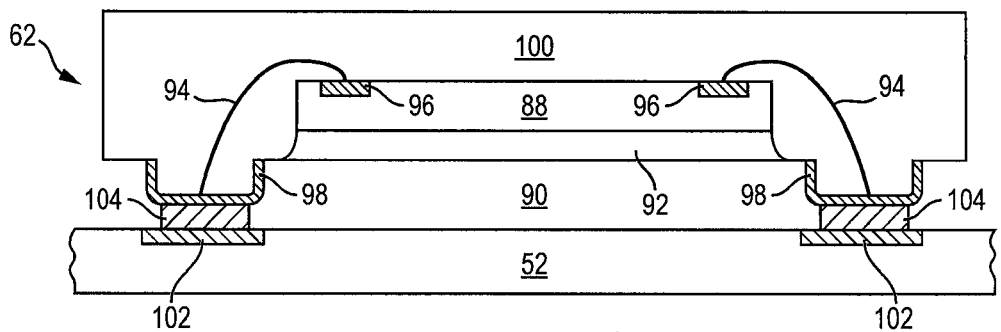
Figure 2C:
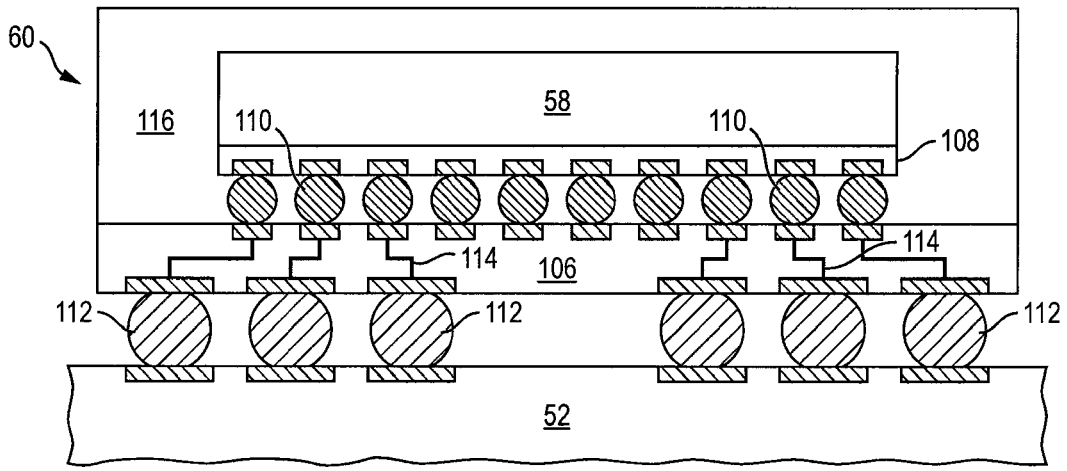

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), Cu, tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
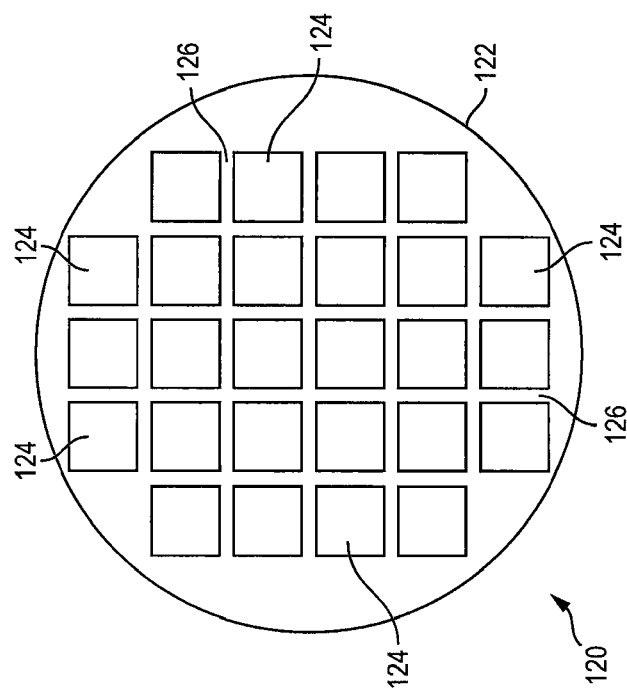

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126, as described above. Saw street 126 provides cutting areas to singulate semiconductor wafer 120 into individual semiconductor die 124.

Figure 3B:
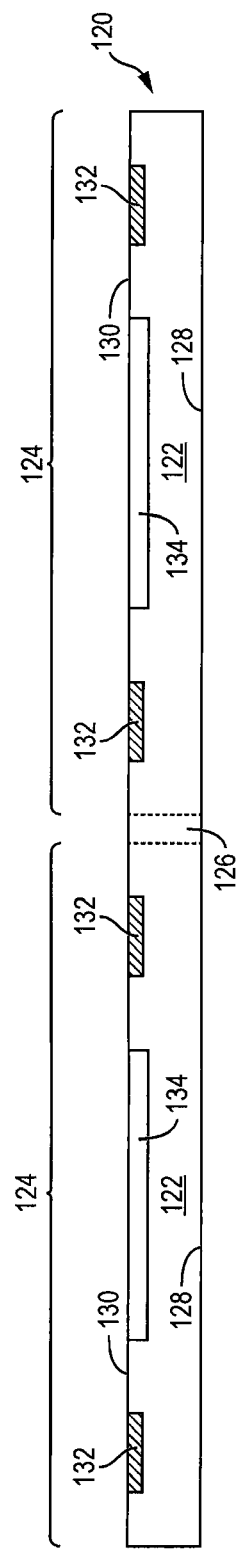

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), application specific integrated circuit (ASIC), memory, or other signal processing circuit. Semiconductor die 124 may also contain integrated passive devices (IPDs), such as inductors, capacitors, and resistors, for RF signal processing.

An active region 134 is formed on active surface 130 of semiconductor die 124, typically during the front-end manufacturing process. In one embodiment, active region 134 contains analog and digital circuits. In another embodiment, active region 134 includes one or more active sensors, such as photodiode, phototransistor, and Hall effect device, having the ability to generate or control the flow of electrical current in response to an external stimulus. Alternatively, active region 134 includes one or more passive sensors, such as a photoresistor, thermistor, capacitive accelerometer, and load cell, having the ability to alter the relationship between voltage and current in response to the external stimulus. Active region 134 can also contain a piezoelectric device, nanoelectronic device, or microelectromechanical device. The external stimulus can be light, sound, electromagnetic radiation, electric field, magnetic field, ionizing radiation, vibration, motion, acceleration, rotation, orientation, pressure, and temperature. Active region 134 is electrically connected to other analog and digital circuits on active surface 130 to perform design functions of semiconductor die 124 in response to the external stimulus.

An electrically conductive layer 132 is formed on active surface 130 using PVD, CVD, electrolytic plating, electroless plating process, or other suitable deposition process. Conductive layer 132 can be one or more layers of Al, Cu, Sn, Ni, Au, Ag, or other suitable electrically conductive material. Conductive layer 132 operates as contact pads electrically connected to active region 134, as well as the analog and digital circuits formed on active surface 130. Conductive layer 132 can be formed as contact pads disposed side-by-side a first distance from the edge of semiconductor die 124, as shown in FIG. 3b. Alternatively, conductive layer 132 can be formed as contact pads that are in multiple rows such that a first row of contact pads is disposed a first distance from the edge of the die, and a second row of contact pads alternating with the first row is disposed a second distance from the edge of the die.

FIG. 3c shows a plan view of an example embodiment of semiconductor wafer 120 including a plurality of semiconductor die 124 each having active region 134 adapted to capture photographic images, such as in a digital camera. Active region 134 can includes an array of light-sensitive sensors 138, such as photodiodes or phototransistors. Active region 134 may also include active devices, passive devices, and interconnect structures electrically connected to sensors 138 and providing the ability to control the accumulation and transmission of electrical signals from the sensors. Furthermore, active region 134 is electrically connected to analog and digital circuits within active surface 130, such as amplifiers, multiplexers, digital-to-analog converters (DAC), and analog-to-digital converters (ADC), providing the ability to electronically capture the signals from sensors 138. In another embodiment, active region 134 contains analog circuits, digital circuits, or devices responsive to an external stimulus.

In FIG. 3d, semiconductor wafer 120 is singulated through saw street 126 using a saw blade or laser cutting tool 136 into individual semiconductor die 124. Alternatively, semiconductor wafer 120 can be singulated using backgrinding, stealth dicing, or scribing.

Figure 4E:
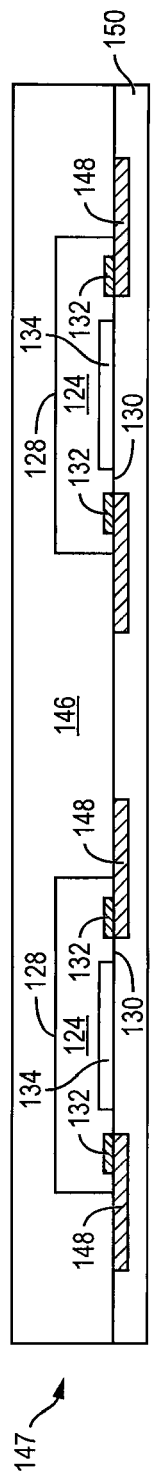

FIGS. 4a-4j illustrate, in relation to FIGS. 1 and 2a-2c, a process of forming a transmissive layer over an eWLB. FIG. 4a shows a cross-sectional view of a portion of a carrier or temporary substrate 140 containing sacrificial base material such as silicon, polymer, beryllium oxide, glass, or other suitable low-cost, rigid material for structural support. An interface layer or double-sided tape 142 is formed over carrier 140 as a temporary adhesive bonding film, etch-stop layer, or thermal release layer. Semiconductor die 124 from FIG. 3d are mounted to interface layer 142 and carrier 140 using a pick and place operation with active surface 130 oriented toward the carrier.

In FIG. 4b, an encapsulant or molding compound 146 is deposited over semiconductor die 124 and carrier 140 to form reconstituted wafer 147 using a paste printing, compressive molding, transfer molding, liquid encapsulant molding, vacuum lamination, spin coating, or other suitable application process. Encapsulant 146 can be polymer composite material, such as epoxy resin with filler, epoxy acrylate with filler, or polymer with proper filler. Encapsulant 146 is electrically non-conductive and environmentally protects the semiconductor device from external elements and contaminants.

In FIG. 4c, carrier 140 and interface layer 142 are removed by chemical etching, mechanical peeling, chemical mechanical polishing (CMP), mechanical grinding, thermal bake, ultraviolet (UV) light, laser scanning, or wet stripping to expose semiconductor die 124, conductive layer 132, active region 134, and encapsulant 146.

In FIG. 4d, an electrically conductive layer or redistribution layer (RDL) 148 is formed over semiconductor die 124 and encapsulant 146 using a patterning and deposition process such as sputtering, electrolytic plating, or electroless plating. Conductive layer 148 can be one or more layers of Al, Cu, Sn, Ni, Au, Ag, or other suitable electrically conductive material. Conductive layer 148 is electrically connected to conductive layer 132 of semiconductor die 124. Portions of conductive layer 148 can be electrically common or electrically isolated depending on the design and function of semiconductor die 124.

In FIG. 4e, a transmissive layer 150 is formed over encapsulant 146, conductive layer 148, and active surface 130, including active region 134. Transmissive layer 150 passes the external stimulus, e.g., sound, electromagnetic radiation, electric field, magnetic field, ionizing radiation, vibration, motion, acceleration, rotation, orientation, pressure, and temperature, to active surface 130 and active region 134. In one embodiment, transmissive layer 150 is an optically transparent or translucent dielectric material for passing light to active region 134. For example, transmissive layer 150 can be optical grade polyimide having a thickness of 10 micrometers (μm). Alternatively, transmissive layer is a dielectric material capable of passing other external stimulus. Transmissive layer 150 can be formed by PVD, CVD, lamination, printing, spin coating, spray coating, or other suitable deposition process.

Figure 4F:
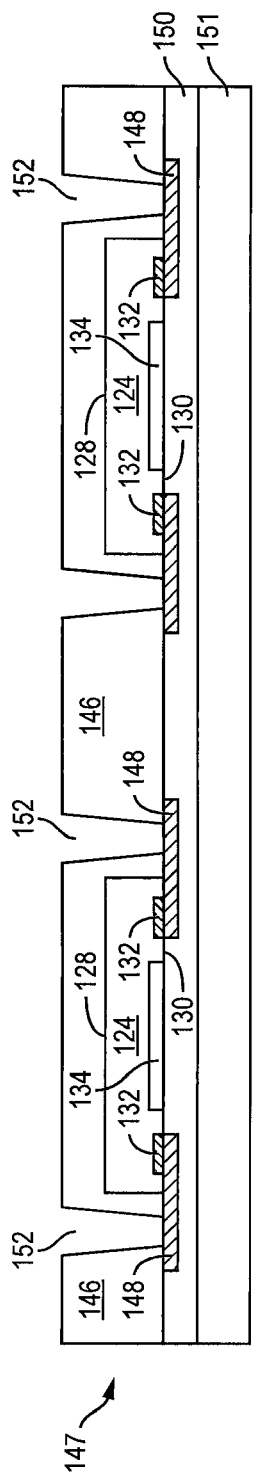
Figure 4G:
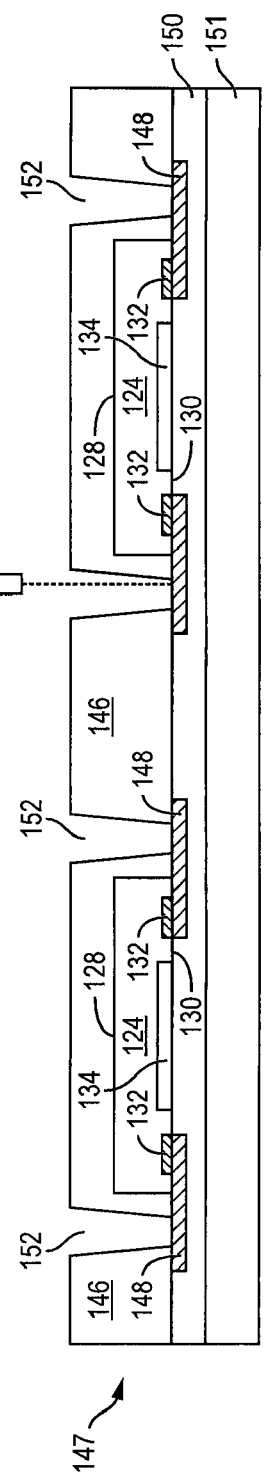

In FIG. 4f, semiconductor die 124 is optionally mounted with transmissive layer 150 oriented to a carrier or temporary substrate 151 containing sacrificial base material such as silicon, polymer, beryllium oxide, glass, or other suitable low-cost, rigid material for structural support. A portion of encapsulant 146 is removed by an etching process through a patterned photoresist layer to form openings 152 and expose conductive layer 148. The openings 152 can also be formed by laser direct ablation (LDA) using laser 154 to remove portions of encapsulant 146 and expose conductive layer 148, as shown in FIG. 4g.

In FIG. 4h, an electrically conductive bump material is deposited into openings 152 over the exposed conductive layer 148 using an evaporation, electrolytic plating, electroless plating, ball drop, or screen printing process. The bump material can include Al, Sn, Ni, Au, Ag, Pb, Bi, Cu, solder, and combinations thereof, with an optional flux solution. For example, the bump material can include eutectic Sn/Pb, high-lead solder, or lead-free solder. The bump material is bonded to conductive layer 148 using a suitable attachment or bonding process. In one embodiment, the bump material is reflowed by heating the material above its melting point to form balls or bumps 156. In some applications, bumps 156 are reflowed a second time to improve electrical contact to conductive layer 148. An under bump metallization (UBM) can be formed under bumps 156. Bumps 156 can also be compression bonded to conductive layer 148. Bumps 156 represent one type of interconnect structure that can be formed over conductive layer 148. The interconnect structure can also use stud bump, micro bump, or other electrical interconnect.

Figure 4I:
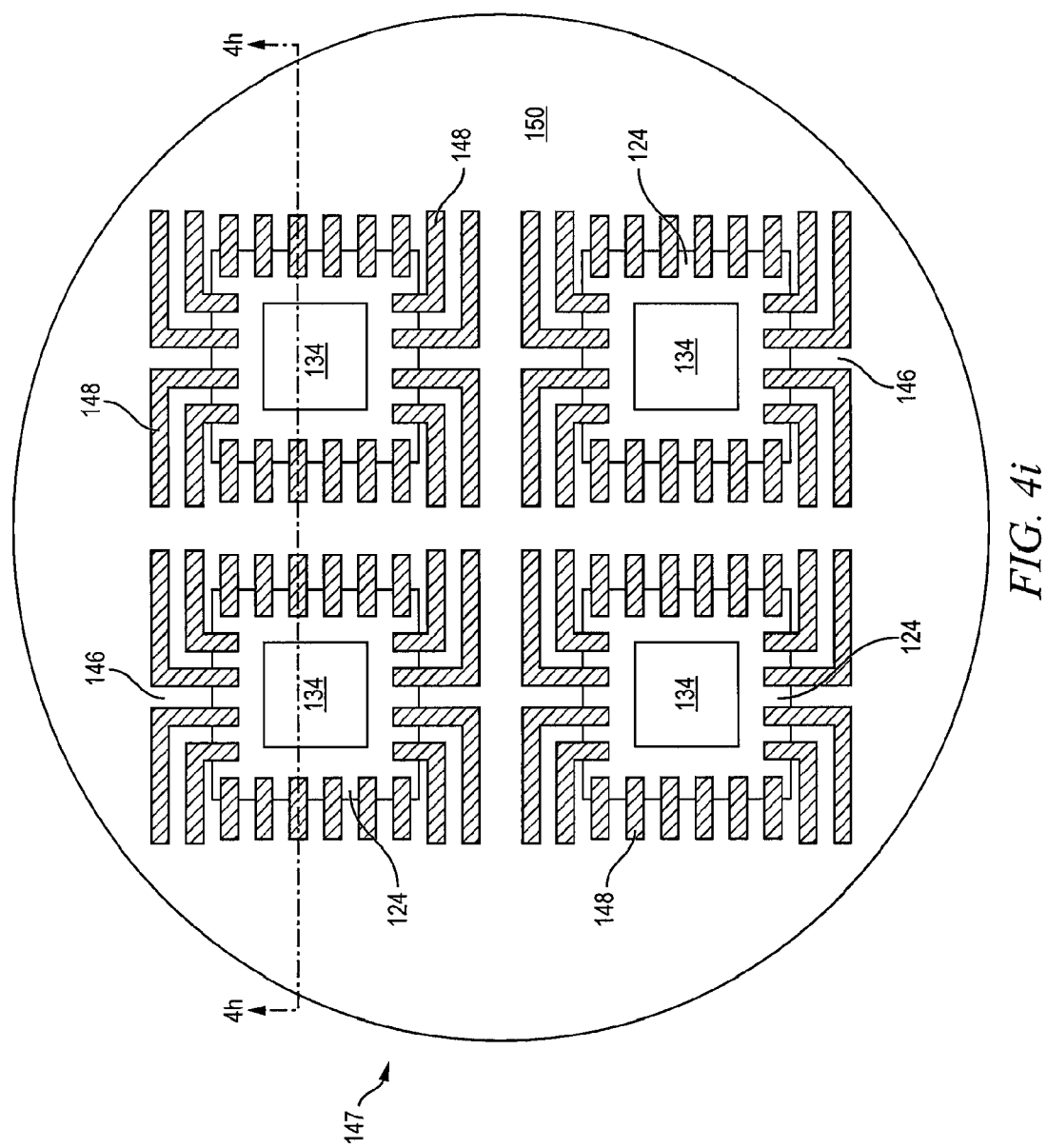

FIG. 4i shows a plan view of reconstituted wafer 147 as seen through transmissive layer 150. Reconstituted wafer 147 includes a plurality of semiconductor die 124 and encapsulant 146 formed around the semiconductor die. Each semiconductor die 124 includes active region 134. Conductive layer 148 is formed over semiconductor die 124 and encapsulant 146 and electrically connected to bumps 156. Transmissive layer 150 is formed over semiconductor die 124, encapsulant 146, and conductive layer 148.

In FIG. 4j, temporary carrier 151 is removed and reconstituted wafer 147 is singulated with saw blade or laser cutting tool 158 into separate embedded wafer level ball grid array (eWLB) packages 160.

FIG. 5 shows eWLB 160 mounted to substrate 162 with bumps 156 metallurgically and electrically connected to conductive layer 164. Active region 134 of semiconductor die 124 is oriented away from substrate 162 and receives an external stimulus 166 through transmissive layer 150. Active region 134 generates signals in response to external stimulus 166. The signals from active region 134 are processed by the analog and digital circuits within active surface 130 of semiconductor die 124. In one embodiment, active region 134 of eWLB 160 includes a sensor for a digital camera or cellular phone capable of receiving control signals through bumps 156 and outputting a digital image through the bumps. Active region 134 includes an array of photodiodes and semiconductor die 124 uses amplification, conversion, memory, and control circuitry to process the signals from active region 134. Semiconductor die 124 communicates with other components using conductive layer 132, conductive layer 148, bumps 156, and conductive layer 164. Communications between semiconductor die 124 and other components include the signals produced by active region 134 in response to external stimulus 166 and/or related to the operation of active region 134. The eWLB 160 has a lesser package thickness as compared to leadframe-based or laminate-based packages. Furthermore, eWLB 160 can be cost-effectively produced using wafer-level or panel-level manufacturing processes.

Figure 6A:
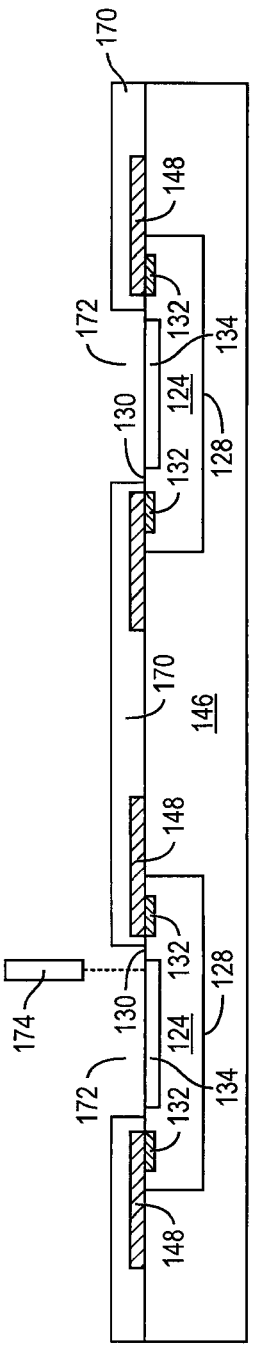

FIGS. 6a-6d illustrate an embodiment of forming a window in an insulating layer over an active region of a semiconductor die in an eWLB. Continuing from FIG. 4d, an insulating or dielectric layer 170 is formed over encapsulant 146 and active surface 130 of semiconductor die 124 using PVD, CVD, printing, spin coating, spray coating, or other suitable deposition process, as shown in FIG. 6a. The insulating layer 170 contains one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), hafnium oxide ($HfO_2$), benzocyclobutene (BCB), polyimide (PI), polybenzoxazoles (PBO), or other suitable insulating material. Alternatively, insulating layer 170 is a transmissive material, such as optical dielectric material, for passing the external stimulus to active surface 130. A portion of insulating layer 170 is removed by an etching process through a patterned photoresist layer to form an opening or window 172 and expose active region 134. Alternatively, window 172 is formed by LDA using laser 174 to expose active region 134.

Figure 6B:
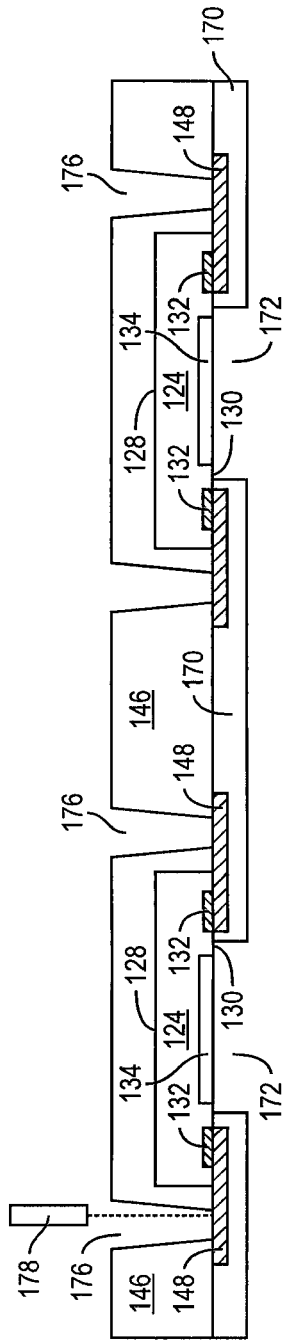

In FIG. 6b, a portion of encapsulant 146 is removed by an etching process through a patterned photoresist layer to form openings 176 and expose conductive layer 148. The openings 176 can also be formed by LDA using laser 178 to expose conductive layer 148.

Figure 6C:
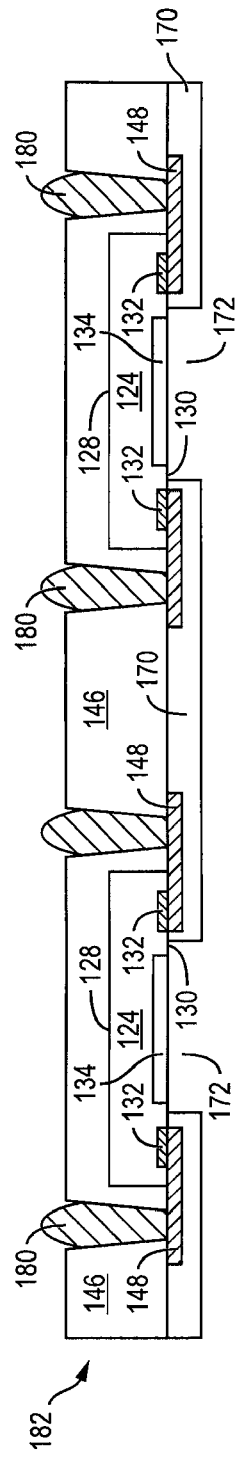

In FIG. 6c, an electrically conductive bump material is deposited into openings 176 over the exposed conductive layer 148 using an evaporation, electrolytic plating, electroless plating, ball drop, or screen printing process. The bump material can include Al, Sn, Ni, Au, Ag, Pb, Bi, Cu, solder, and combinations thereof, with an optional flux solution. For example, the bump material can include eutectic Sn/Pb, high-lead solder, or lead-free solder. The bump material is bonded to conductive layer 148 using a suitable attachment or bonding process. In one embodiment, the bump material is reflowed by heating the material above its melting point to form balls or bumps 180. In some applications, bumps 180 are reflowed a second time to improve electrical contact to conductive layer 148. A UBM layer can be formed under bumps 180. Bumps 180 can also be compression bonded to conductive layer 148. Bumps 180 represent one type of interconnect structure that can be formed over conductive layer 148. The interconnect structure can also use stud bump, micro bump, or other electrical interconnect.

In FIG. 6d, reconstituted wafer 182 is singulated with saw blade or laser cutting tool 184 into separate eWLB 186.

FIG. 7 shows eWLB 186 mounted to substrate 188 with bumps 180 metallurgically and electrically connected to conductive layer 190. Active region 134 of semiconductor die 124 is oriented away from substrate 188 and receives external stimulus 192 through window 172. Active region 134 generates signals in response to external stimulus 192. In one embodiment, the signals from active region 134 are processed by analog and digital circuits within semiconductor die 124. Semiconductor die 124 communicates with other components using conductive layer 132, conductive layer 148, bumps 180, and conductive layer 190. The eWLB 186 has a lesser package thickness as compared to leadframe-based or laminate-based packages. Furthermore, eWLB 186 can be cost-effectively produced using wafer-level or panel-level manufacturing processes.

Figure 8A:
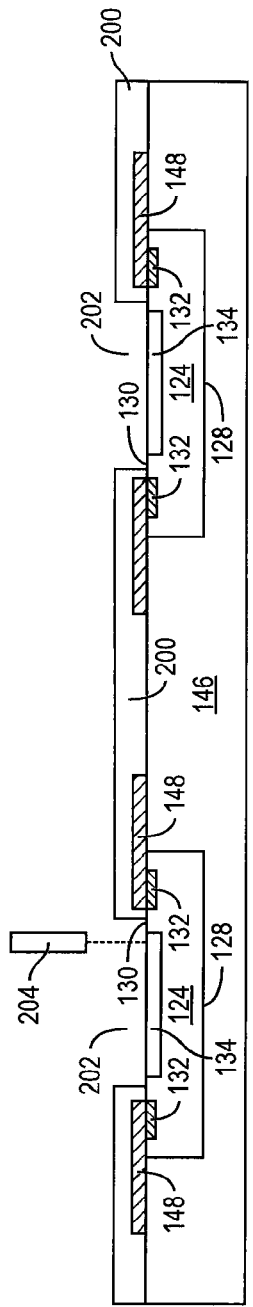
FIGS. 8a-8e illustrate a process of forming a transmissive layer over a window in an insulating layer relative to an active region of a semiconductor die in an eWLB.

FIGS. 8a-8e illustrate a process of forming a transmissive layer over a window in an insulating layer relative to an active region of a semiconductor die in an eWLB. Continuing from FIG. 4d, an insulating or dielectric layer 200 is formed over encapsulant 146 and active surface 130 of semiconductor die 124 using PVD, CVD, printing, spin coating, spray coating, or other suitable deposition process, as shown in FIG. 8a. The insulating layer 200 contains one or more layers of $SiO_2$, $Si_3N_4$, SiON, $Ta_2O_5$, $Al_2O_3$, $HfO_2$, BCB, PI, PBO, or other suitable insulating material. Alternatively, insulating layer 200 is a transmissive material, such as optical dielectric material, for passing the external stimulus to active surface 130. A portion of insulating layer 200 is removed by an etching process through a patterned photoresist layer to form an opening or window 202 and expose active region 134. Alternatively, window 202 is formed by LDA using laser 204 to expose active region 134.

Figure 8B:
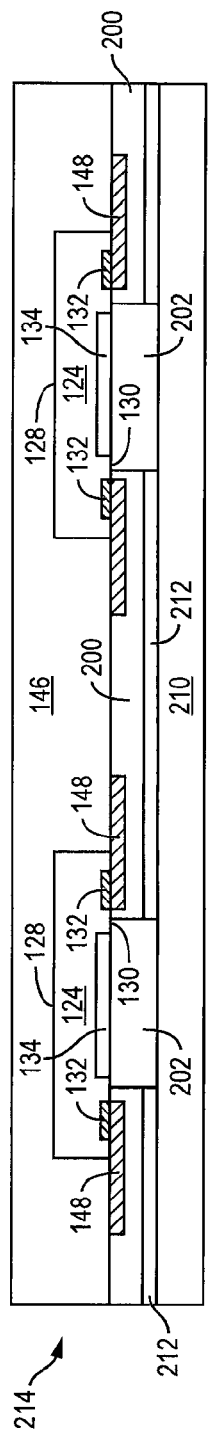

FIG. 8b shows transmissive layer 210 containing a material selected to pass an external stimulus to active region 134. For example, transmissive layer 210 includes glass, quartz, optical dielectric material, or other optically transparent or translucent material. An interface layer or double-sided tape 212 is formed over transmissive layer 210 as an adhesive bonding film. Alternatively, interface layer 212 is formed over insulating layer 200. Transmissive layer 210 is mounted over reconstituted wafer 214 and secured by interface layer 212.

Figure 8C:
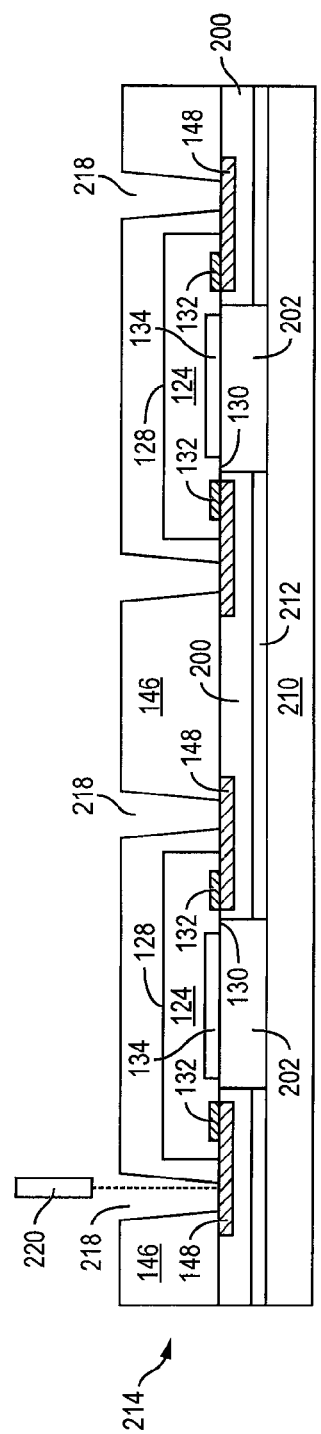

In FIG. 8c, a portion of encapsulant 146 is removed by an etching process through a patterned photoresist layer to form openings 218 and expose conductive layer 148. The openings 218 can also be formed by LDA using laser 220 to expose conductive layer 148.

Figure 8D:
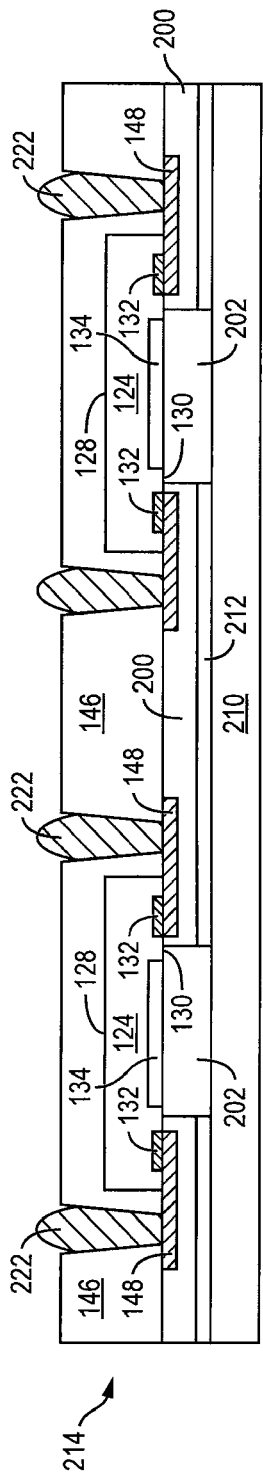

In FIG. 8d, an electrically conductive bump material is deposited into openings 218 over the exposed conductive layer 148 using an evaporation, electrolytic plating, electroless plating, ball drop, or screen printing process. The bump material can include Al, Sn, Ni, Au, Ag, Pb, Bi, Cu, solder, and combinations thereof, with an optional flux solution. For example, the bump material can include eutectic Sn/Pb, high-lead solder, or lead-free solder. The bump material is bonded to conductive layer 148 using a suitable attachment or bonding process. In one embodiment, the bump material is reflowed by heating the material above its melting point to form balls or bumps 222. In some applications, bumps 222 are reflowed a second time to improve electrical contact to conductive layer 148. A UBM layer can be formed under bumps 222. Bumps 222 can also be compression bonded to conductive layer 148. Bumps 222 represent one type of interconnect structure that can be formed over conductive layer 148. The interconnect structure can also use stud bump, micro bump, or other electrical interconnect.

Figure 8E:
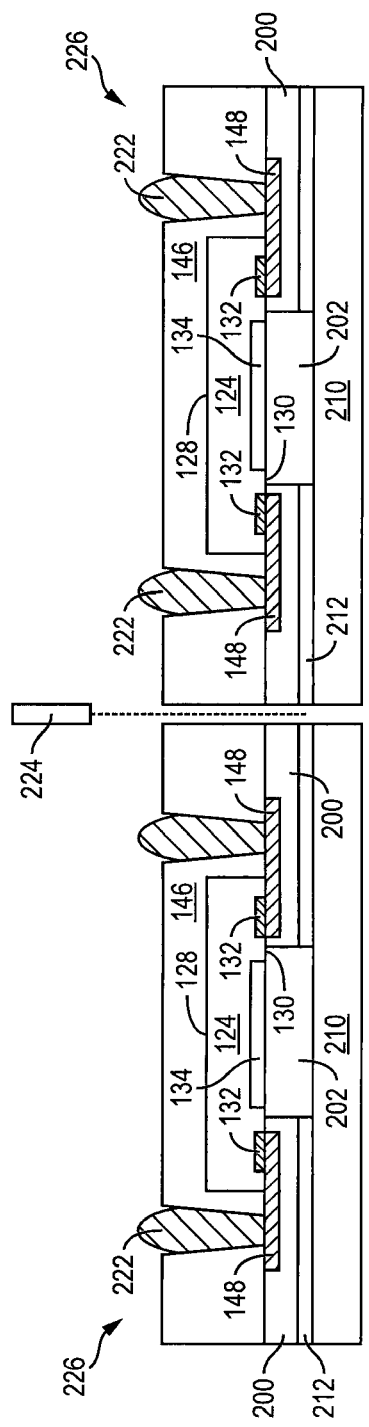

In FIG. 8e, reconstituted wafer 214 is singulated with saw blade or laser cutting tool 224 into separate eWLB 226.

Figure 9:
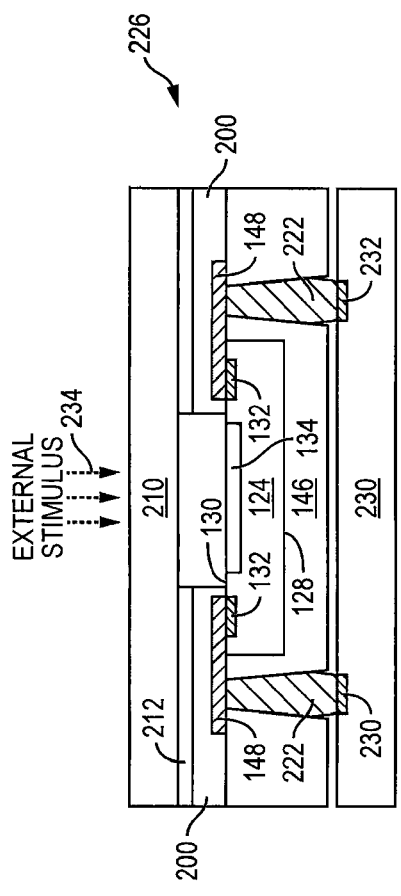
FIG. 9 illustrates the transmissive layer formed over the eWLB.

FIG. 9 shows eWLB 226 mounted to substrate 230 with bumps 222 metallurgically and electrically connected to conductive layer 232. Active region 134 of semiconductor die 124 is oriented away from substrate 230 and receives external stimulus 234 through transmissive layer 210 and window 202. Active region 134 generates signals in response to external stimulus 234. The signals from active region 134 are processed by analog and digital circuits within semiconductor die 124. Semiconductor die 124 communicates with other components using conductive layer 132, conductive layer 148, bumps 222, and conductive layer 232. The eWLB 226 has a lesser package thickness as compared to leadframe-based or laminate-based packages. Furthermore, eWLB 226 can be cost-effectively produced using wafer-level or panel-level manufacturing processes.

Figure 10A:
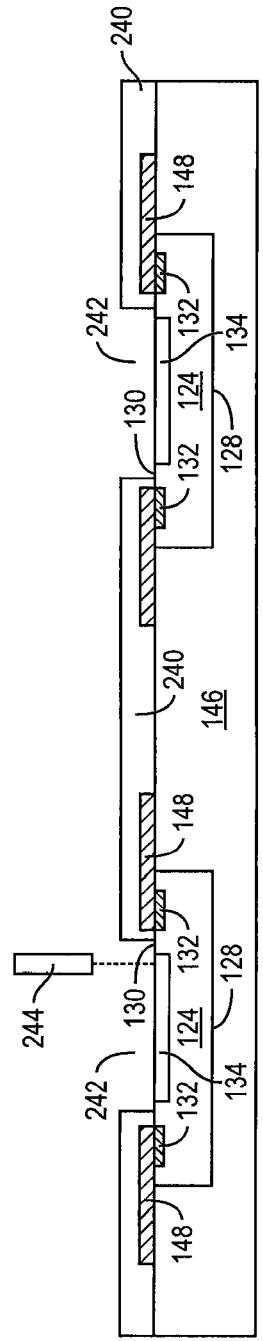
FIGS. 10a-10f illustrate another process of forming a transmissive layer over a window in an insulating layer relative to an active region of a semiconductor die in an eWLB.

FIGS. 10a-10f illustrate another process of forming a transmissive layer over a window in an insulating layer relative to an active region of a semiconductor die in an eWLB. Continuing from FIG. 4d, an insulating or dielectric layer 240 is formed over encapsulant 146 and active surface 130 of semiconductor die 124 using PVD, CVD, printing, spin coating, spray coating, or other suitable deposition process, as shown in FIG. 10a. The insulating layer 240 contains one or more layers of SiO2, Si3N4, SiON, Ta2O5, Al2O3, HfO2, BCB, PI, PBO, or other suitable insulating material. Alternatively, insulating layer 240 is a transmissive material, such as optical dielectric material, for passing the external stimulus to active surface 130. A portion of insulating layer 240 is removed by an etching process through a patterned photoresist layer to form an opening or window 242 and expose active region 134. Alternatively, window 242 is formed by LDA using laser 244 to expose active region 134.

Figure 10B:
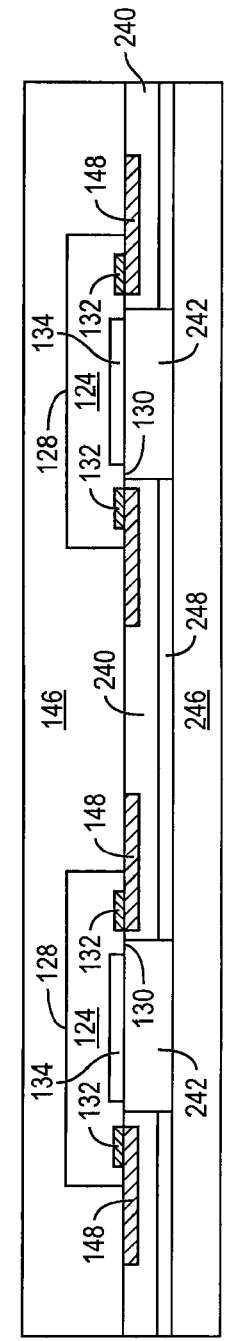

FIG. 10b shows substrate or carrier 246 containing temporary or sacrificial base material such as silicon, polymer, beryllium oxide, or other suitable low-cost, rigid material for structural support. An interface layer or double-sided tape 248 is formed over carrier 246 as a temporary adhesive bonding film or etch-stop layer. Leading with insulating layer 240 and window 242, reconstituted wafer 250 is mounted to interface layer 248 over carrier 246.

Figure 10C:
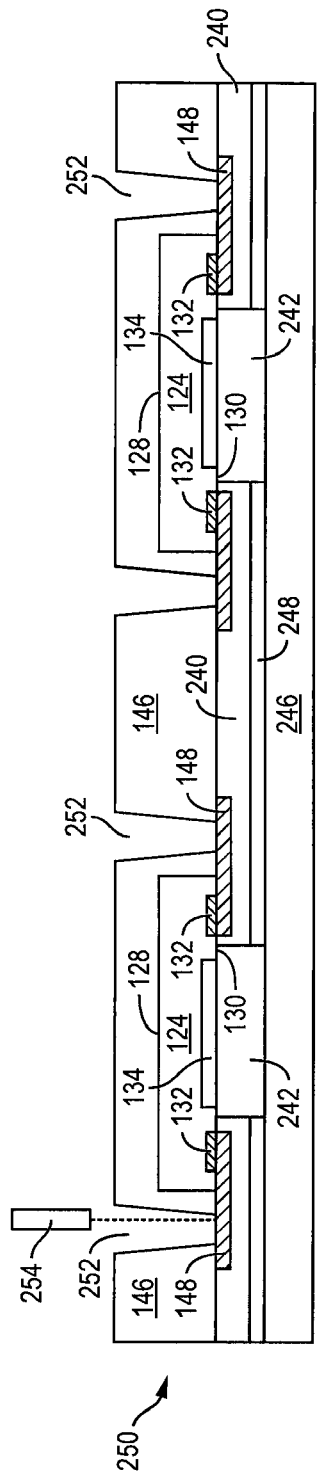

In FIG. 10c, a portion of encapsulant 146 is removed by an etching process through a patterned photoresist layer to form openings 252 and expose conductive layer 148. The openings 252 can also be formed by LDA using laser 254 to expose conductive layer 148.

Figure 10D:
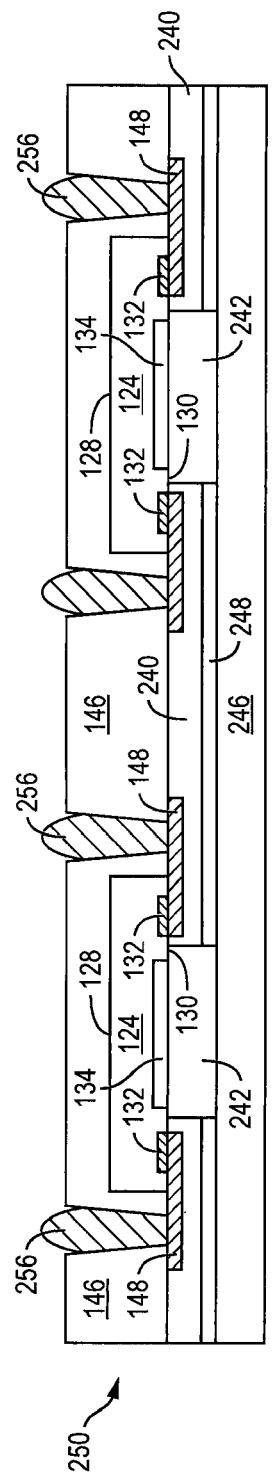

In FIG. 10d, an electrically conductive bump material is deposited into openings 252 over the exposed conductive layer 148 using an evaporation, electrolytic plating, electroless plating, ball drop, or screen printing process. The bump material can include Al, Sn, Ni, Au, Ag, Pb, Bi, Cu, solder, and combinations thereof, with an optional flux solution. For example, the bump material can include eutectic Sn/Pb, high-lead solder, or lead-free solder. The bump material is bonded to conductive layer 148 using a suitable attachment or bonding process. In one embodiment, the bump material is reflowed by heating the material above its melting point to form balls or bumps 256. In some applications, bumps 256 are reflowed a second time to improve electrical contact to conductive layer 148. A UBM can be formed under bumps 256. Bumps 256 can also be compression bonded to conductive layer 148. Bumps 256 represent one type of interconnect structure that can be formed over conductive layer 148. The interconnect structure can also use stud bump, micro bump, or other electrical interconnect.

Figure 10E:
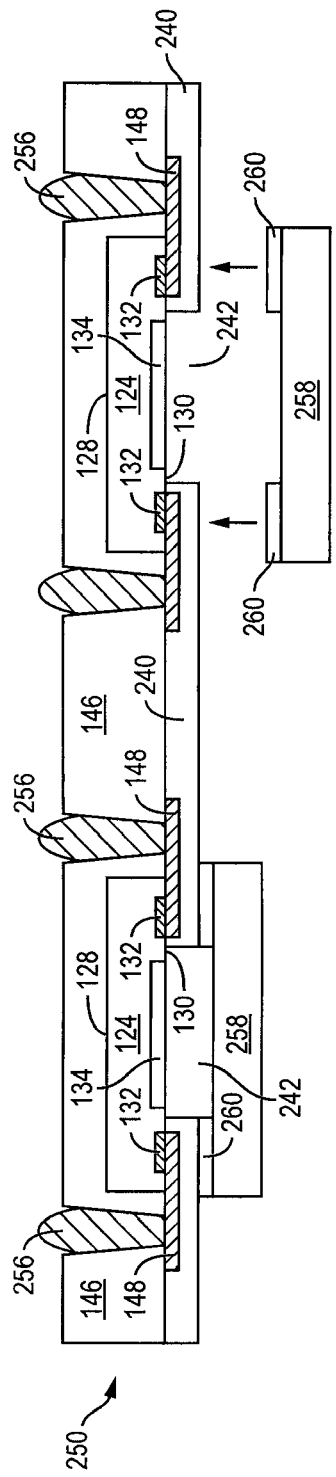

In FIG. 10e, carrier 246 and interface layer 248 are removed by chemical etching, mechanical peeling, CMP, mechanical grinding, thermal bake, UV light, laser scanning, or wet stripping to expose insulating layer 240.

Transmissive layer 258 contains a material such as glass, quartz, optical dielectric material, optical transparent or translucent material, or other suitable material selected to pass an external stimulus to active region 134. An interface layer or double-sided tape 260 is formed over transmissive layer 258 as an adhesive bonding film. Transmissive layer 258 is mounted over window 242 and active region 134 of reconstituted wafer 250. Alternatively, interface layer 260 is formed over insulating layer 240 around window 242 and transmissive layer 258 is mounted to interface layer 260 over active region 134.

Figure 10F:
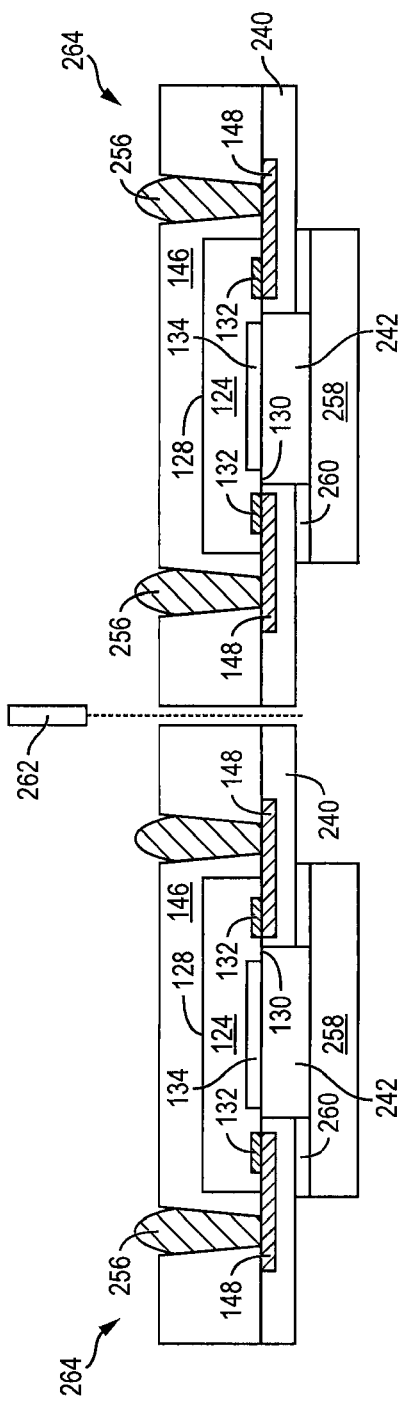

In FIG. 10f, reconstituted wafer 250 is singulated with saw blade or laser cutting tool 262 into separate eWLB 264.

Figure 11A:
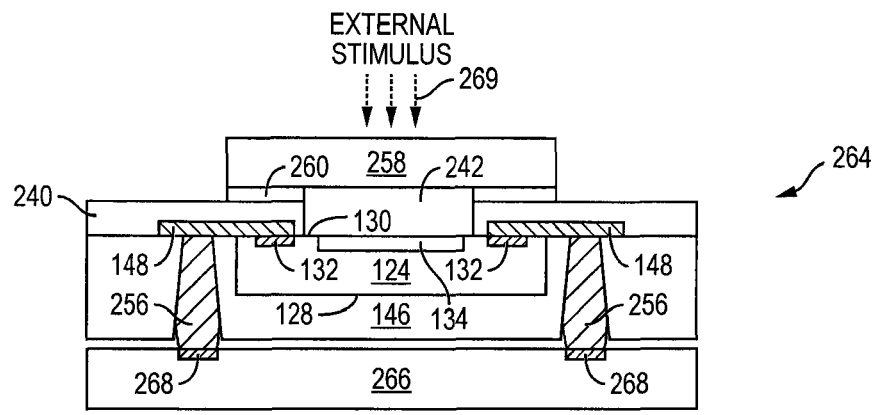
FIGS. 11a-11b illustrate the transmissive layer formed over the eWLB according to FIGS. 10a-10f.
Figure 11B:
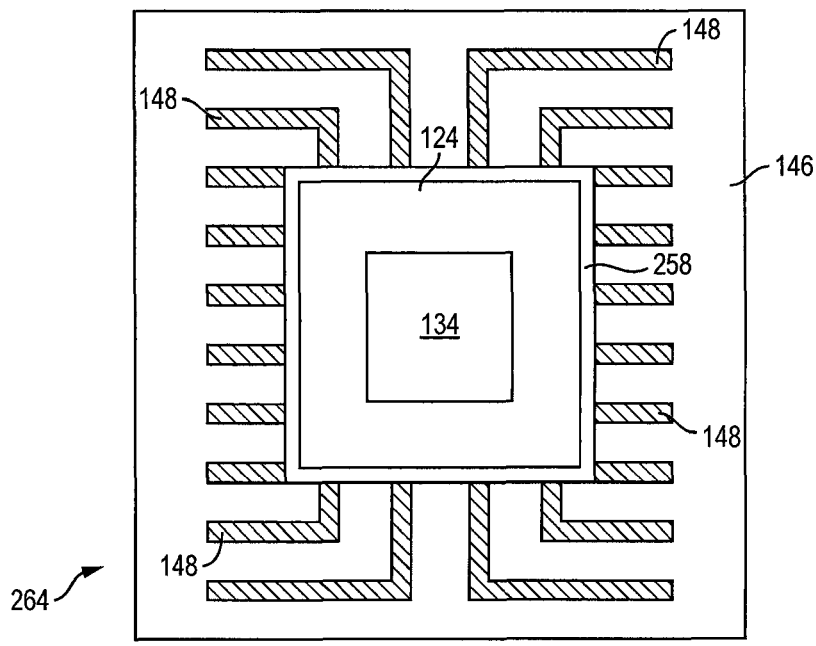

FIG. 11a shows a cross-sectional view of eWLB 264 mounted to substrate 266 with bumps 256 metallurgically and electrically connected to conductive layer 268. FIG. 11b shows a plan view of eWLB 264 as seen through transmissive layer 258. Active region 134 of semiconductor die 124 is oriented away from substrate 266 and receives external stimulus 269 through transmissive layer 258 and window 242. Active region 134 generates signals in response to external stimulus 269. The signals from active region 134 are processed by analog and digital circuits within semiconductor die 124. Semiconductor die 124 communicates with other components using conductive layer 132, conductive layer 148, bumps 256, and conductive layer 268. The eWLB 264 has a lesser package thickness as compared to leadframe-based or laminate-based packages. Furthermore, eWLB 264 can be cost-effectively produced using wafer-level or panel-level manufacturing processes.

Figure 12A:
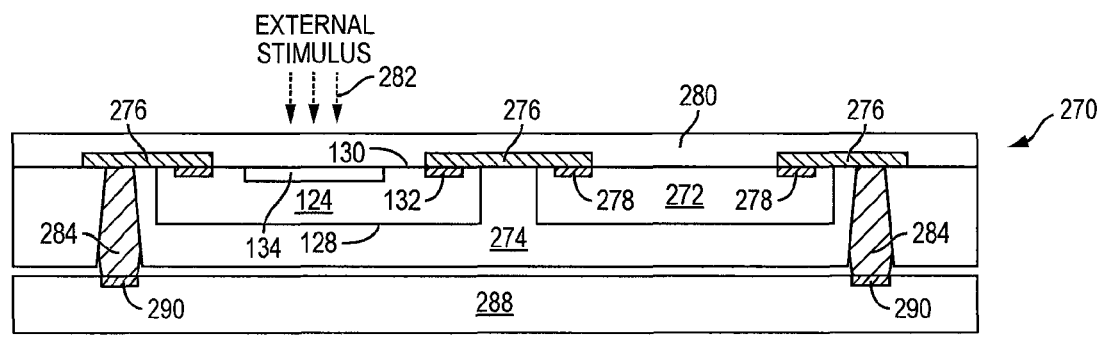
FIGS. 12a-12b illustrate an eWLB with two adjacent semiconductor die.

FIG. 12a illustrates another embodiment of eWLB 270, similar to FIG. 5, with semiconductor die 272 disposed adjacent to semiconductor die 124. An encapsulant 274 is deposited over semiconductor die 124 and 272, similar to FIG. 4b. Conductive layer or RDL 276 is formed over semiconductor die 124 and 272 and encapsulant 274 and electrically connected to conductive layers 132 and 278. Transmissive layer 280 is formed over semiconductor die 124 and 272 to pass external stimulus 282 to active region 134. A portion of encapsulant 274 is removed and bumps 284 are formed in the openings. The eWLB 270 is mounted to substrate 288 with bumps 284 electrically connected to conductive layer 290.

Figure 12B:
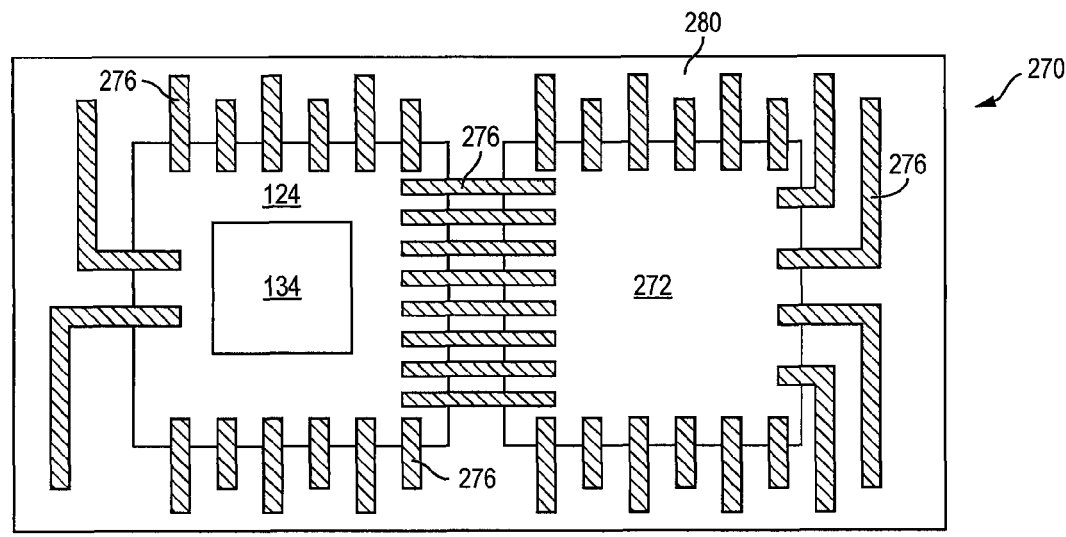

FIG. 12b shows a plan view of eWLB 270 through transmissive layer 280. Active region 134 of semiconductor die 124 receives external stimulus 282 through transmissive layer 280. Active region 134 generates signals in response to external stimulus 282. The signals from active region 134 are processed by the analog and digital circuits within semiconductor die 124 and 272. In one embodiment, semiconductor die 272 is an ASIC, DSP, or memory device. The eWLB 270 has a lesser package thickness as compared to leadframe-based or laminate-based packages. Furthermore, eWLB 270 can be cost-effectively produced using wafer-level or panel-level manufacturing processes.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a first semiconductor wafer including a plurality of first semiconductor die, wherein each first semiconductor die includes an active region comprising a sensor formed on a first surface of the first semiconductor die;
   singulating the first semiconductor wafer to separate the first semiconductor die;
   depositing an encapsulant over and around the first semiconductor die after singulating the first semiconductor wafer;
   forming a first conductive layer over a first surface of the encapsulant and the first surface of the first semiconductor die;
   forming a transmissive layer over the active region of the first semiconductor die and first conductive layer;
   forming an opening through the encapsulant outside a footprint of the semiconductor die and extending to the first conductive layer;

depositing a bump material into the opening with the bump material contacting the first conductive layer and extending above a second surface of the encapsulant opposite the first surface of the encapsulant;

providing a substrate including a second conductive layer formed over the substrate; and mounting the first semiconductor die to the substrate with the bump material contacting the second conductive layer, wherein the bump material comprises a portion of solder extending uninterrupted between the first conductive layer and second conductive layer.

2. The method of claim 1, wherein the active region is responsive to an external stimulus passing through the transmissive layer.

3. The method of claim 1, further including:
forming an insulating layer over the first semiconductor die; and
forming an opening in the insulating layer over the active region.

4. The method of claim 1, further including:
disposing a second semiconductor die adjacent to the first semiconductor die prior to depositing the encapsulant; and
forming the first conductive layer with a portion of the first conductive layer coupling the first semiconductor die to the second semiconductor die.

5. A method of making a semiconductor device, comprising:
providing a first semiconductor die including an active region;
forming an encapsulant over the first semiconductor die;
forming a first conductive layer over the first semiconductor die and encapsulant;
forming an insulating layer over the first semiconductor die and first conductive layer;
forming a first opening in the insulating layer over the active region;
forming a second opening through the encapsulant and extending to the first conductive layer;
forming a bump in the second opening and through the encapsulant;
providing a substrate including a second conductive layer formed on the substrate; and
metallurgically and electrically connecting the bump to the second conductive layer, wherein the bump includes a solder portion extending completely between the first conductive layer and substrate.

6. The method of claim 5, wherein the active region is responsive to an external stimulus passing through the first opening in the insulating layer.

7. The method of claim 5, further including forming a transmissive layer over the first opening in the insulating layer opposite the semiconductor die.

8. The method of claim 7, wherein the transmissive layer includes an optical dielectric material or an optically transparent or translucent material.

9. The method of claim 5, wherein the active region of the first semiconductor die includes a sensor.

10. The method of claim 5, further including metallurgically and electrically connecting the bump to the first conductive layer.

11. The method of claim 5, further including disposing a second semiconductor die adjacent to the first semiconductor die.

12. A method of making a semiconductor device, comprising:
providing a semiconductor die;
depositing an encapsulant over the semiconductor die;
forming a transmissive layer over the semiconductor die and a first surface of the encapsulant; and
forming a bump completely through the encapsulant with a solder portion of the bump extending in an uninterrupted vertical column from the first surface of the encapsulant to a point above an external surface of the semiconductor device opposite the transmissive layer.

13. The method of claim 12, wherein the semiconductor die includes an active region responsive to an external stimulus passing through the transmissive layer.

14. The method of claim 13, further including:
forming an insulating layer over the semiconductor die; and
forming an opening in the insulating layer over the active region of the semiconductor die.

15. The method of claim 12, wherein the transmissive layer includes an optical dielectric material or an optically transparent or translucent material.

16. The method of claim 12, further including forming a conductive layer over the encapsulant and semiconductor die and electrically connected to the bump.

17. A semiconductor device, comprising:
a semiconductor die;
an encapsulant deposited over and around the semiconductor die;
a conductive layer formed over the semiconductor die and encapsulant; and
a conductive bump formed completely through the encapsulant outside a footprint of the semiconductor die with a portion of the conductive bump extending in an uninterrupted vertical column from the conductive layer to a point above an external surface of the semiconductor device opposite the conductive layer.

18. The semiconductor device of claim 17, wherein the semiconductor die includes an active region responsive to an external stimulus.

19. The semiconductor device of claim 18, wherein the active region includes a sensor.

20. The semiconductor device of claim 18, further including an insulating layer comprising an opening formed over the active region of the semiconductor die.

21. The method of claim 12, further including:
providing a substrate including a first conductive layer; and
mounting the semiconductor die to the substrate with the bump contacting the first conductive layer and the solder portion of the bump extending uninterrupted from the first surface of the encapsulant to the first conductive layer.

22. The semiconductor device of claim 17, further including a substrate physically contacting the conductive bump outside a footprint of the semiconductor die.

23. The semiconductor device of claim 17, further including a transmissive layer formed over the semiconductor die, encapsulant, and conductive layer.

24. The method of claim 21, further including:
forming a second conductive layer on the semiconductor die and the first surface of the encapsulant; and
mounting the semiconductor die to the substrate with a first point of contact between the solder portion of the bump and the second conductive layer directly over a second point of contact between the solder portion of the bump and the first conductive layer.

25. The method of claim 1, further including mounting the first semiconductor die to the substrate with the portion of solder including a center through the opening that extends uninterrupted and substantially uniformly from the first conductive layer to the second conductive layer.

* * * * *